(12) United States Patent
Itani

(10) Patent No.: US 8,164,490 B2
(45) Date of Patent: Apr. 24, 2012

(54) DATA COMPRESSION/DECOMPRESSION METHOD AND COMPUTER READABLE STORAGE MEDIUM STORING COMPRESSION/DECOMPRESSION PROGRAM

(75) Inventor: Noriko Itani, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 86 days.

(21) Appl. No.: 12/845,586

(22) Filed: Jul. 28, 2010

(65) Prior Publication Data

US 2010/0289676 A1 Nov. 18, 2010

Related U.S. Application Data

(63) Continuation of application No. PCT/JP2008/000121, filed on Jan. 31, 2008.

(51) Int. Cl.
*H03M 7/46* (2006.01)
(52) U.S. Cl. ............................. 341/63; 341/50; 341/51
(58) Field of Classification Search ............... 341/63, 341/50, 51, 107; 375/107
See application file for complete search history.

(56) References Cited

U.S. PATENT DOCUMENTS

| 5,572,206 | A | 11/1996 | Miller et al. | |
|---|---|---|---|---|
| 5,953,723 | A * | 9/1999 | Linoff et al. | 1/1 |
| 5,959,560 | A * | 9/1999 | Said et al. | 341/107 |
| 6,577,254 | B2 * | 6/2003 | Rasmussen | 341/51 |
| 6,819,271 | B2 * | 11/2004 | Geiger et al. | 341/51 |
| 7,215,259 | B2 | 5/2007 | Kerber et al. | |
| 7,253,752 | B2 | 8/2007 | Sakaguchi | |
| 7,400,274 | B2 * | 7/2008 | Fallon et al. | 341/51 |
| 2002/0101367 | A1 * | 8/2002 | Geiger et al. | 341/51 |
| 2006/0170574 | A1 * | 8/2006 | Itani | 341/51 |
| 2006/0273933 | A1 | 12/2006 | Kerber et al. | |
| 2007/0146173 | A1 | 6/2007 | Sakaguchi | |
| 2007/0194953 | A1 * | 8/2007 | Cho | 341/50 |
| 2008/0175312 | A1 * | 7/2008 | Zhang | 375/240 |

FOREIGN PATENT DOCUMENTS

| JP | 8-69370 | 3/1996 |
|---|---|---|
| JP | 8-139610 | 5/1996 |
| JP | 2002-43950 | 2/2002 |
| JP | 2006-295853 | 10/2006 |
| JP | 2007-37115 | 2/2007 |

OTHER PUBLICATIONS

International Search Report for Application No. PCT/JP2008/00121; mailed Apr. 22, 2008.

* cited by examiner

*Primary Examiner* — Jean B Jeanglaude
(74) *Attorney, Agent, or Firm* — Staas & Halsey LLP

(57) ABSTRACT

Repetitive portions are sequentially detected in compression target data, and it is determined whether the approximately corresponding position of each repetitive portion is under a word-repetition condition, which is a position corresponding to a multiple of a length of an instruction word, or whether the position is under a byte-repetition condition. When it is under a word-repetition condition, a word-repetition code including at least a value obtained by dividing an approximately corresponding position by an instruction word length and a value specifying a length of a corresponding portion is generated and output as compressed data. When it is a byte-repetition condition, a byte-repetition code including at least a value specifying an approximately corresponding position and a value specifying a length of a corresponding portion is generated and output as compressed data.

8 Claims, 9 Drawing Sheets

POSITION        0123456789012345678
ORIGINAL DATA   compress_decompress (CORRESPONDING POSITION, LENGTH OF CORRESPONDING PORTION) = (0, 8)

F I G. 1

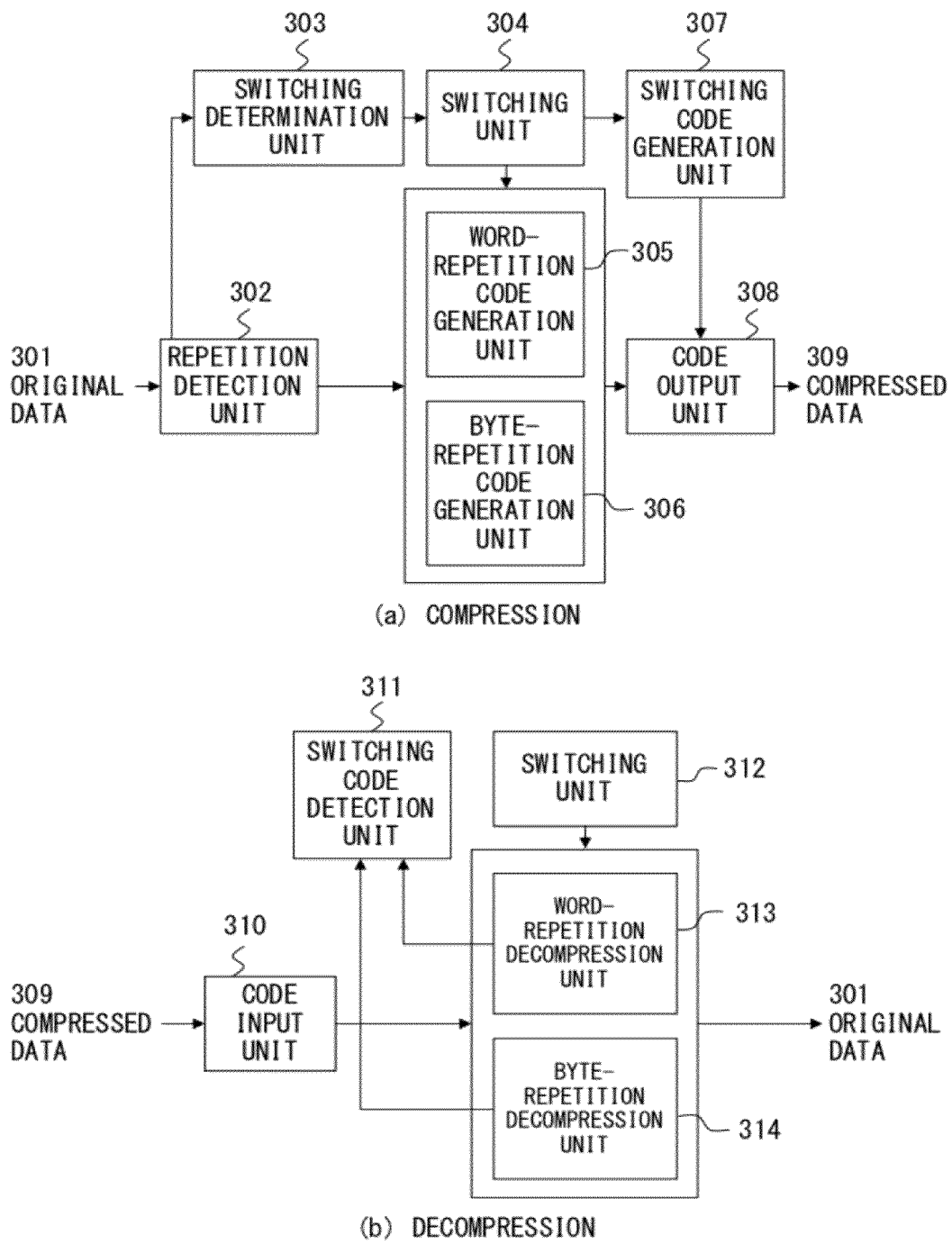
F I G. 3

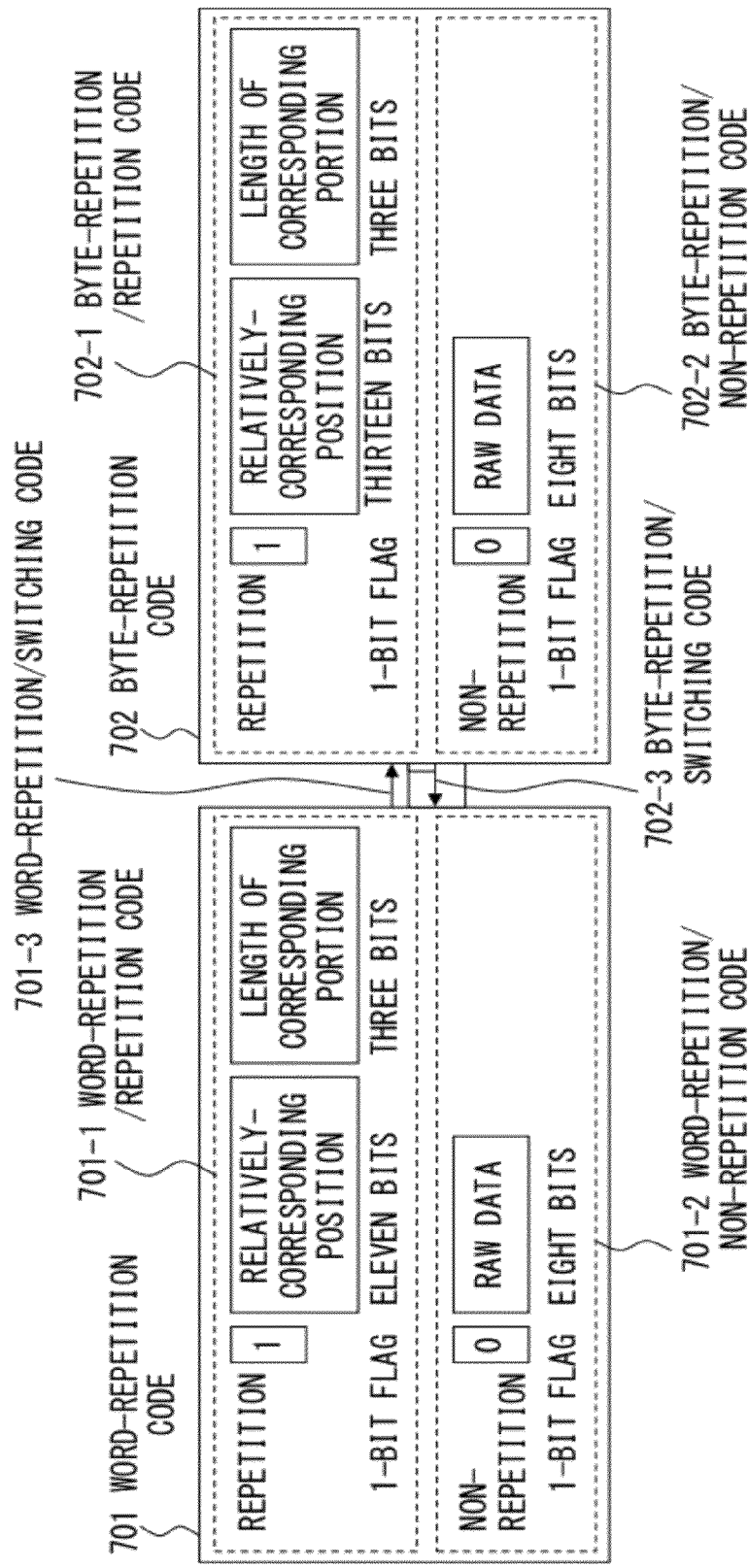
F I G. 7

DATA COMPRESSION/DECOMPRESSION METHOD AND COMPUTER READABLE STORAGE MEDIUM STORING COMPRESSION/DECOMPRESSION PROGRAM

CROSS-REFERENCE TO RELATED APPLICATIONS

This application is a continuation of PCT application PCT/JP2008/000121 which was filed on Jan. 31, 2008.

FIELD

The embodiments discussed herein are related to a data compression/decompression technology for realizing a system that compresses/communicates electronic data in a compact manner.

BACKGROUND

As applications in embedded devices have become more enriched, the increased amount of data being stored and communicated for such applications has become problematic.

A technology has been known that uses a data compression technology to encode data in a lossless manner so that the data amount is reduced in such cases as the above.

Reduction in data brings about the effects of reduction in memory cost, communications cost, and power consumption. It also brings about an effect of speeding up of systems as a whole because a smaller amount of data is transmitted through memory buses and communications lines.

A conventional method of data compression is illustrated in FIG. 1. This method is a substitutional compression method referred to as an LZ77 algorithm, which imposes a lower processing load, enabling data reduction in a reasonable manner. According to this method, repetitive character strings that are as long as possible are detected in a data buffer, and such repetitive strings are encoded on the basis of their positions and the length of the corresponding portion.

Applications consist of instruction codes and data. In instruction code portions, each word is expressed using plural bytes (four bytes, for example). Thus, repetitions are often detected at corresponding positions between words, such as at the first byte or the third byte as illustrated in, for example, FIG. 2. In other words, repetitions are often found at positions corresponding to multiples of 4 in view of relative positions in units of bytes (in the case of four-byte codes).

However, in conventional technologies such as the LZ77 algorithm or the like, processes are performed uniformly on instruction code portions and data portions, preventing effective data compression on the basis of the above regularity.

The technique disclosed in Patent Document 1 described below is characterized in that a repetitive portion having a relative position equal to or lower than a threshold value is encoded with respect to a repetition in which the length of a corresponding portion is "1", the encoding being performed in a special manner of encoding based on the LZ77 type, where encoding is conducted using the length of a corresponding portion and corresponding positions.

However, this conventional technique does not enable effective compression of applications that consist of both instruction codes and data, although this technique has a function of switching encoding methods in response to the situation.

The technique disclosed in Patent Document 2 described below is characterized in that an analyzer unit detects differences in meanings between the same numerical value strings expressed in bytes (or detects whether such strings are numbers, characters, or the like) so as to detect correspondence, while taking the meanings into consideration in encoding based on the LZ77 type.

However, this conventional technique uses a parser for semasiological analyses before searching for repetitions, and thus imposes heavier burdens and requires parser dictionaries, making itself unsuitable for data compression of applications for mobile devices.

Patent Document 1: Japanese Laid-open Patent Publication No. 2007-37115
Patent Document 2: Japanese Laid-open Patent Publication No. 08-69370

SUMMARY

The first aspect of the invention is based on a method or a program that generates compressed data by compressing compression target data that includes an instruction code.

First, a repetition condition determination step is executed of sequentially detecting repetitive portions in the compression target data and determining whether an approximately corresponding position of the repetitive portion is under a first repetition condition, which is a position corresponding to a multiple of an instruction word length as the number of bytes expressing the instruction code, or a second repetition condition, which is not the first repetition condition.

When the repetitive portion is under a first repetition condition, a first repetition code (word-repetition code) generation step is executed of generating a first repetition code including at least a value specifying a compression—approximately corresponding position, obtained by dividing the approximately corresponding position that corresponds to the repetitive portion by the instruction word length, and a value specifying a length of a corresponding portion at the approximately corresponding position in the repetitive portion, and of outputting the generated code as the compressed data, the generation and the outputting occurring when the repetitive portion is under the first repetition condition.

When the repetitive portion is under a second repetition condition, a second repetition code (byte-repetition code) generation step is executed of generating a second repetition code including at least a value specifying the approximately corresponding position that corresponds to the repetitive portion and a value specifying a length of corresponding portion at the approximately corresponding position in the repetitive portion, and of outputting the generated code, the generation and the outputting occurring when the repetitive portion is under the second repetition condition.

Then, a switching code generation step is executed of generating a switching code for switching between the first and second repetition codes and of outputting the generated code as the compressed data.

In the above first aspect of the invention, it is possible to further include a step of switching to the first repetition code when the first repetition condition has occurred consecutively a prescribed number of times (T times) after the second repetition condition, and a step of switching to the second repetition code when the second repetition condition has occurred at least once after the first repetition condition.

In the above first aspect of the invention, it is possible to employ a configuration in which a value directly specifying byte data of the compression target data as the first repetition code or the second repetition code is output when the length of a corresponding portion is shorter than a prescribed number of bytes, and the first repetition code or the second repetition code includes a flag for specifying whether or not the value directly specifying byte data of the compression target data has been output in the first repetition code generation step or the second repetition code generation step.

The second aspect of the invention is based on a method or a program that restores compression target data from compressed data generated by compressing compression target data that includes an instruction code.

A switching step is executed of extracting a switching code for switching between the first and second repetition codes from the compressed data, and of switching between the first repetitive portion decompression step and the second repetitive portion decompression step to be performed, the switching being performed on the basis of a timing of the extraction.

In the first repetitive portion decompression step, a compression—approximately corresponding position and a length of a corresponding portion are extracted from a first repetition code including at least a value specifying the compression—approximately corresponding position, obtained by dividing an approximately corresponding position by an instruction word length, which is the number of bytes expressing the instruction code, and a value specifying the length of a corresponding portion at the approximately corresponding position, and constituting the compressed data, wherein the approximately corresponding position is calculated by multiplying the compression—approximately corresponding position by the instruction word length, which is a first repetitive portion corresponding to the calculated approximately corresponding position, the extracted length of corresponding portion is restored from the compression target data that has already been restored, and the restored portion is output as the compression target data.

In the second repetitive portion decompression step, the approximately corresponding position and the length of a corresponding portion are extracted from a second repetition code including at least a value specifying the approximately corresponding position and a value specifying a length of a corresponding portion at the approximately corresponding position, and constituting the compressed data, wherein a second repetitive portion corresponding to the extracted approximately corresponding position and the extracted length of a corresponding portion are restored from the compression target data that has already been restored, and the restored portion is output as the compression target data.

In the above second aspect, it is possible to employ a configuration in which byte data of the compression target data is extracted directly from data included in the first repetition code or the second repetition code when a flag included in the first repetition code or the second repetition code specifies that a value directly specifying byte data of the compression target data has been output in the first repetitive portion decompression step or the second repetitive portion decompression step.

According to the above first and second aspects of the invention, it is possible to utilize characteristics of instruction word lengths of instruction codes given to a CPU so as to effectively compress/restore instruction codes with a reduced processing burden. Thereby, the time it takes a CPU to read instruction codes from RAM or the like is reduced when initiating, for example, a mobile terminal, an embedded device, or the like, and thus boot time can be reduced.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 1 illustrates a conventional method of compressing data in which repetitive portions in data are encoded on the basis of the positions and the lengths of the corresponding portions;

FIG. 3 is a functional block diagram according to an embodiment of the invention;

FIG. 7 illustrates formats of a word-repetition code and a byte-repetition code;

DESCRIPTION OF EMBODIMENTS

Figure 2:
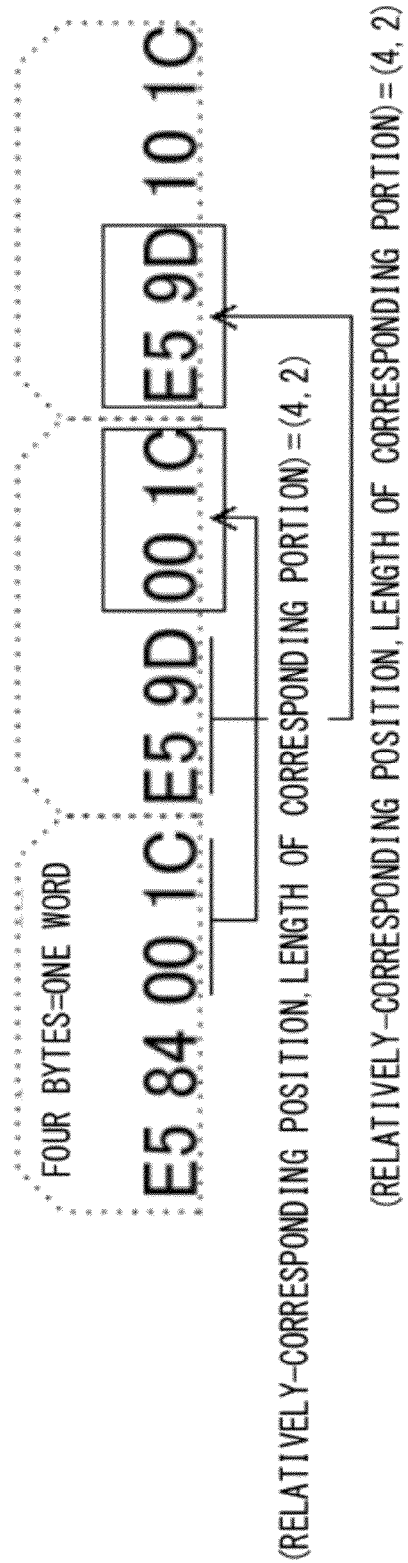
FIG. 2 illustrates regularity in data in an instruction code.

Hereinafter, embodiments of the invention will be explained in detail by referring to the drawings.

FIG. 3 illustrate block diagrams of embodiments of the invention. FIG. 3(a) illustrates a functional block diagram of an embodiment for compressing data. FIG. 3(b) illustrates a functional block diagram of an embodiment for restoring data.

First, explanations will be given for the functional block diagram on the data compression side illustrated in FIG. 3(a).

A repetition detection unit 302 sequentially and temporarily holds, for example, 8 kilobytes (or 8192 bytes) of original data 301, which is compression target data such as an application or the like including both instruction codes and data, and detects repetitions in the original data 301.

A switching determination unit 303 determines whether a repetition detected by the repetition detection unit 302 is a word repetition, which corresponds to an instruction code portion, or is a byte repetition, which corresponds to a data portion.

A switching unit 304 switches between a process to be performed by a word-repetition code generation unit 305 and a process to be performed by a byte-repetition code generation unit 306 on the basis of a result of determination performed by the switching determination unit 303.

The word-repetition code generation unit 305 generates a repetition code in units of words corresponding to an instruction code portion detected by the repetition detection unit 302.

The byte-repetition code generation unit 306 generates a repetition code in units of bytes corresponding to a data portion detected by the repetition detection unit 302.

A switching code generation unit 307 generates a switching code at a boundary portion at which the switching unit 304 switches repetition codes.

A code output unit 308 combines codes generated by the word-repetition code generation unit 305, the byte-repetition code generation unit 306, and the switching code generation unit 307, and outputs the combined codes as compressed data 309.

The compressed data 309 obtained in the above manner is stored in a storage medium such as ROM or the like of, for example, a mobile phone or an embedded device.

Next, explanations will be given for the functional block diagram on the data decompression side illustrated in FIG. 3(b).

The compressed data 309 read from a storage medium such as ROM or the like of, for example, a mobile phone or an embedded device is input to a code input unit 310, and the code is extracted from the code input unit 310.

A switching code detection unit 311 detects a switching code from among codes restored by a word-repetition decompression unit 313 and a byte-repetition decompression unit 314.

A switching unit 312 operates either the word-repetition decompression unit 313 or the byte-repetition decompression unit 314 on the basis of a switching code detected by the switching code detection unit 311.

The word-repetition decompression unit 313 restores a word-repetition code input from the code input unit 310, and extracts an instruction code portion in order to output the instruction code portion as the original data 301.

The byte-repetition decompression unit 314 restores a byte-repetition code input from the code input unit 310, and extracts a data portion in order to output the data portion as the original data 301.

Figure 4:
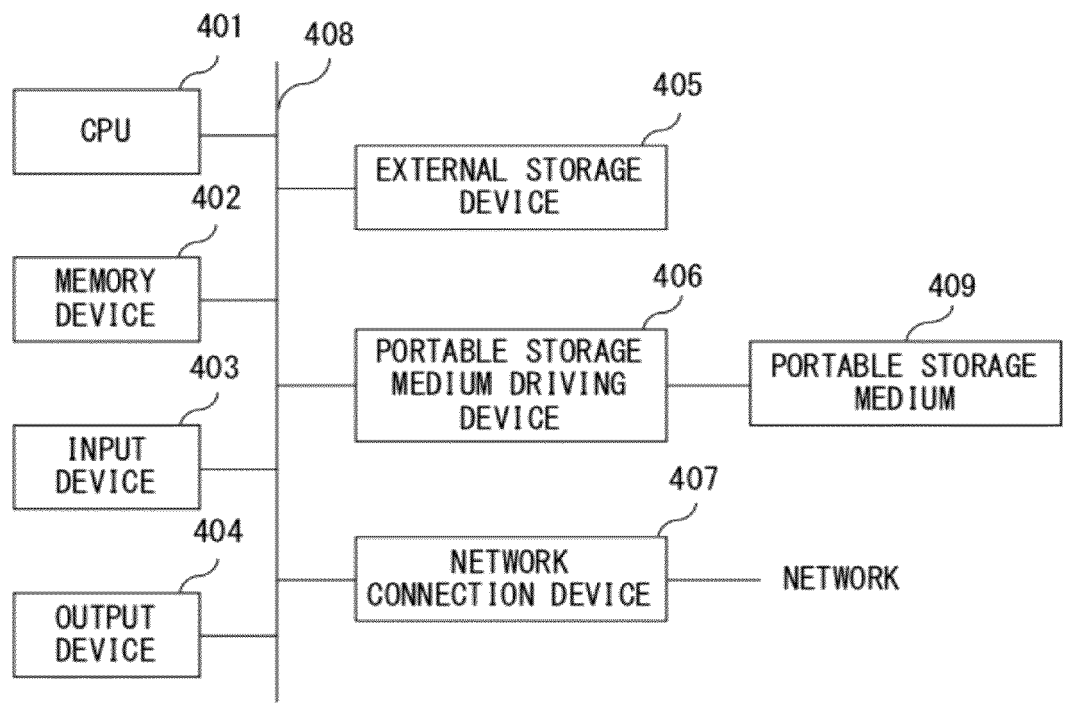
FIG. 4 illustrates a hardware configuration in which a program according to an embodiment of the invention is executed.
Figure 5:
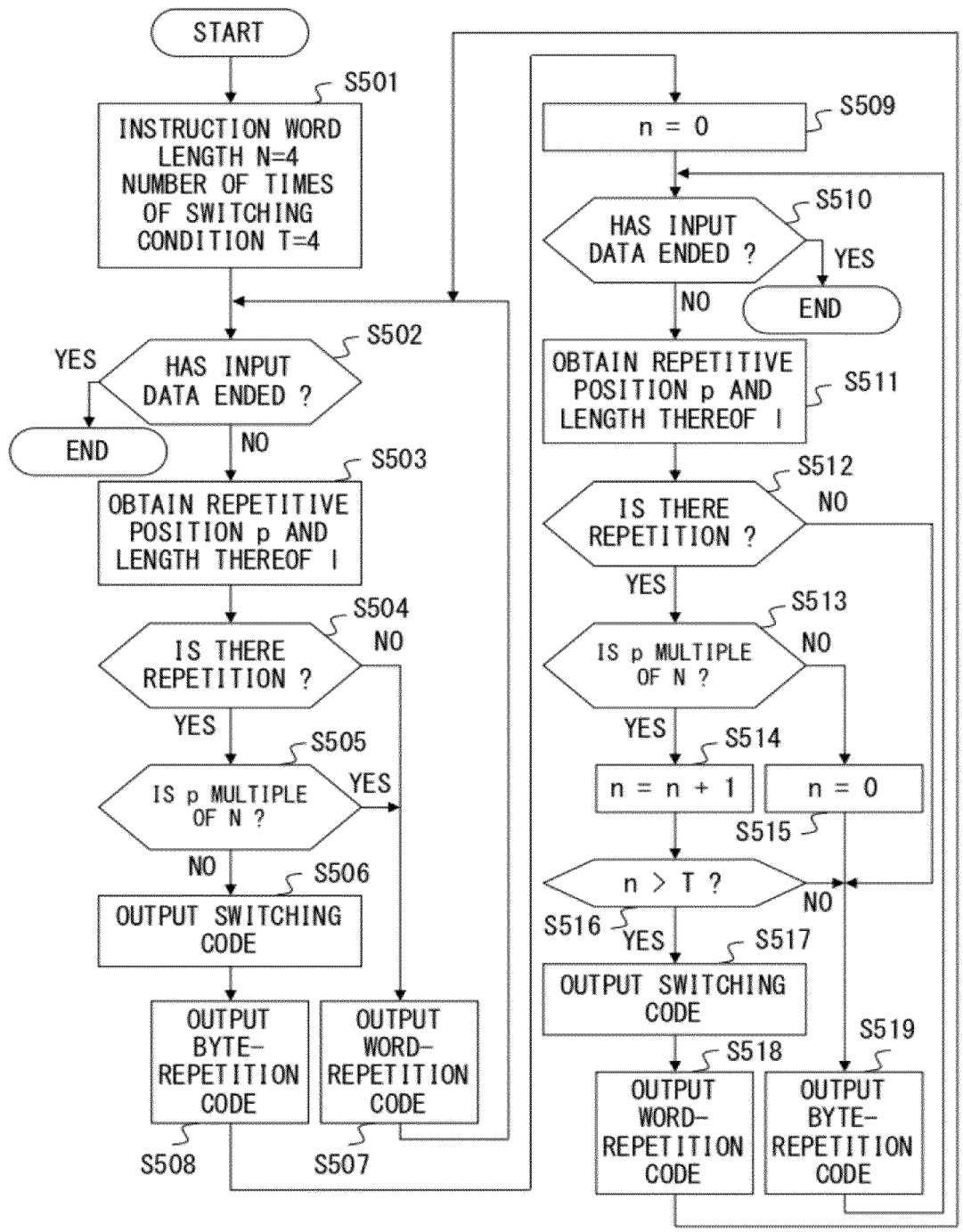
FIG. 5 is an operational flowchart corresponding to a data compression program according to an embodiment of the invention.
Figure 6:
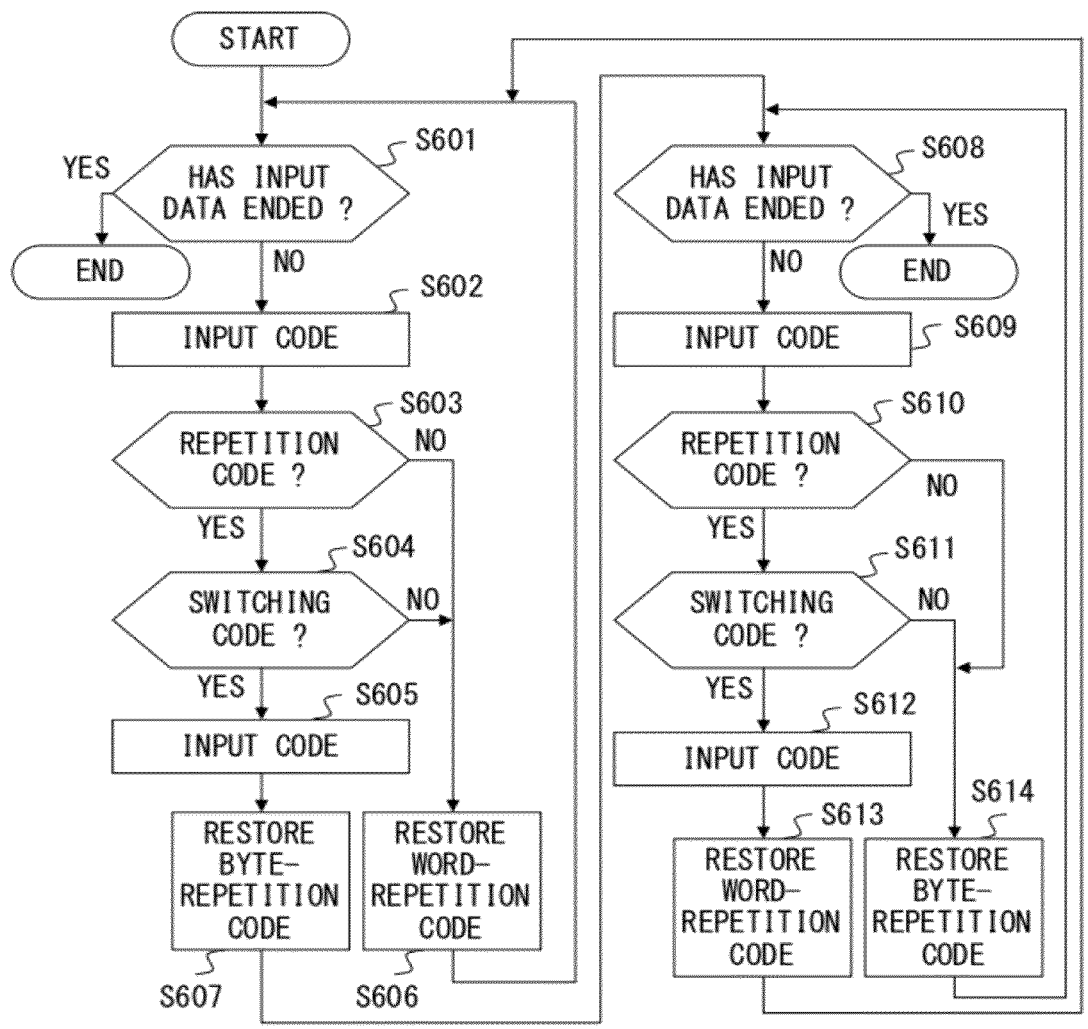
FIG. 6 is an operational flowchart corresponding to a data decompression program according to an embodiment of the invention.

FIG. 4 illustrates an example of a hardware configuration of a computer that executes computer programs in a case when the functional block configurations illustrated in FIGS. 3(a) and 3(b) are implemented by computer programs corresponding to the individual operations described in the operational flowchart illustrated in FIGS. 5 and 6.

The computer illustrated in FIG. 4 includes a CPU 401, a memory device 402, an input device 403, an output device 404, an external storage device 405, a portable storage medium driving device 406 into which a portable storage medium 409 is inserted, and a network connection device 407, all of which are connected to each other via a bus 408. The configuration illustrated in FIG. 4 is an example of a computer capable of implementing the above system, and thus such a computer is not limited to this configuration.

The computer illustrated in FIG. 4 is a computer for compressing data, such as a workstation, server, or the like that implements data compression functions, when programs installed in the computer implement the processes described in the operational flowchart illustrated in FIG. 5, which corresponds to FIG. 3 (a), and this computer is a computer for a mobile phone, a mobile terminal, an embedded device, or the like that implements data decompression functions when the programs in the computer implement the processes described in the operational flowchart illustrated in FIG. 6, which corresponds to FIG. 3(b).

The CPU 401 controls the entire computer. The memory device 402 is RAM or the like for temporarily storing the programs and data stored in the external storage device 405 (or the portable storage medium 409) upon execution of the programs, updating of the data, or the like. When the configuration in FIG. 4 is a configuration of a computer for compressing data, the memory device 402 temporarily stores the data compression program, corresponding to the operational flowchart illustrated in FIG. 5, and the compressed data 309 generated by that program. When the configuration in FIG. 4 is a configuration of a computer for a mobile phone, an embedded device or the like, the memory device 402 temporarily stores a data decompression program, corresponding to the operational flowchart in FIG. 6, the compressed data 309 to be restored by that program, and the original data 301 of the application program, data or the like, that are obtained by the decompression. The CPU 401 reads the above program onto the memory device 402 to execute the program, and thereby controls the entire computer.

When the configuration in FIG. 4 is a configuration of a computer for compressing data, the input device 403 includes, for example, a keyboard, a mouse, or the like, and an interface control device for them. When the configuration illustrated in FIG. 4 is a configuration of a computer for a mobile phone, an embedded device, or the like, the input device 403 includes a ten-key keypad, a pointer device, or the like of a mobile phone, an embedded device, and an interface control device for them. The input device 403 detects input operations performed by users through a keyboard, a mouse, or the like, and reports the detection result to the CPU 401.

When the configuration in FIG. 4 is a configuration of a computer for compressing data, the output device 404 includes a display device, a printing device, or the like, and an interface control device for them. When the configuration illustrated in FIG. 4 is a configuration of a computer for a mobile phone, an embedded device, or the like, the output device 404 includes a display device and an interface control device for a mobile phone, an embedded device, or the like. The output device 404 outputs, to the display device or the printing device, data transmitted under control of the CPU 401.

When the configuration in FIG. 4 is a configuration of a computer for compressing data, the external storage device 405 is, for example, a hard disk storage device. When the configuration illustrated in FIG. 4 is a configuration of a computer for a mobile phone, an embedded device, or the like, the external storage device 405 is a ROM memory disk device or a RAM memory disk device. The external storage device 405 is used for storing the above described programs, the compressed data 309, the original data 301, etc.

When the configuration in FIG. 4 is a configuration of a computer for compressing data, portable storage medium driving device 406 serves as the portable storage medium 409, such as an optical disk, a CD, a DVD, or the like. When the configuration illustrated in FIG. 4 is a configuration of a computer for a mobile phone, an embedded device, or the like, the portable storage medium driving device 406 accommodates the portable storage medium 409, such as SDRAM/micro SDRAM or the like, so as to assist the external storage device 405.

When the configuration in FIG. 4 is a configuration of a computer for compressing data, the network connection device 407 is a device for connecting communications lines such as, for example, LANs (Local Area Networks) or WANs (Wide Area Networks). When the configuration illustrated in FIG. 4 is a configuration of a computer for a mobile phone, an embedded device, or the like, the network connection device 407 is a device for connecting communications lines for mobile phone communications lines or WANs.

The system according to the present embodiment is implemented by the CPU 401 executing the program including the data compression function illustrated in FIG. 3(a) and corresponding to the operational flowchart illustrated in FIG. 5, or executing the program including the data decompression function illustrated in FIG. 3(b) and corresponding to the operation program illustrated in FIG. 6. Such programs may be distributed in a form that they are recorded in, for example, the external storage device 405 and the portable storage medium 409, or may be obtained through a network by using the network connection device 407.

Explanations will be given sequentially for operations of the program implemented by the above described hardware configuration and including the data compression function illustrated in FIG. 3(*a*), and for operations of the program including the data decompression function illustrated in FIG. 3(*b*), by referring to the operational flowcharts in FIGS. 5 and 6, and for the operation explanation views of FIGS. 7 through 9.

In the above described embodiment, when implementing the data compression function illustrated in FIG. 3(*a*) or FIG. 5, the switching determination unit 303 determines the value of an approximately corresponding position obtained by the repetition detection unit 302, makes the switching unit 304 switch between the word-repetition code generation unit 305 and the byte-repetition code generation unit 306, and makes the respective generation units perform encoding.

As was explained by referring to FIG. 2, when the original data 301 includes both instruction codes and data, one instruction word is expressed by, for example, four bytes in the instruction code portion, and it is highly likely that repetitions in units of instruction words will be detected.

Accordingly, in the present embodiment, the repetition detection unit 302 illustrated in FIG. 3 searches the past eight kilobytes of data for a portion containing the same data as the data being encoded currently, that is, a repetitive portion. When the repetition detection unit 302 has detected a repetition at a position corresponding to a multiple of instruction word length N, the word-repetition code generation unit 305 generates a word-repetition code.

As illustrated in FIG. 7, the word-repetition code generation unit 305 expresses the repetitive portion at a position corresponding to a multiple of instruction word length N by using a word-repetition/repetition code 701-1, including a 1-bit flag having the value 1 for indicating a repetition, an approximately corresponding position, and the length of a corresponding portion.

In the operational flowchart illustrated in FIG. 5, the loop including steps S502, S503, S504, S505, S507, and S502 is executed after instruction word length N is set to four (N=4) in step S501 (conditions for the number of times of switching will be described later).

When a data portion having corresponding portions shorter than 2 bytes in the search for word repetitions has been detected, the word-repetition code generation unit 305 expresses a word-repetition/non-repetition code 701-2, including a 1-bit flag having the value 0 for indicating a non-repetition and the original data itself (i.e. raw data).

In the operational flowchart illustrated in FIG. 5, the loop including steps S502, S503, S504, S507, and S502 is executed.

When the switching determination unit 303 in FIG. 3 has detected the fact that a repetition was detected in the past eight kilobytes of data, at a position not corresponding to a multiple of instruction word length N in a repetition detection operation performed by the repetition detection unit 302, the switching determination unit 303 determines that the original data 301 has transitioned from the instruction code portion to the data portion, and the switching unit 304 switches from operations by the word-repetition code generation unit 305 to operations by the byte-repetition code generation unit 306 on the basis of the detection result. As a result, the byte-repetition code generation unit 306 generates a byte-repetition code.

In the above process, the switching unit 304 makes the word-repetition code generation unit 305 output a word-repetition/switching code 701-3 in the same code format as that of the word-repetition/repetition code 701-1 before the byte-repetition code generation unit 306 generates the code. This switching code is, for example, a special code including a 1-bit flag (=1), an approximately corresponding position (=0), and the length of the corresponding portion (=0).

In the operational flowchart illustrated in FIG. 5, steps S504, S505, S506, and S508 are performed.

As illustrated in FIG. 7, the byte-repetition code generation unit 306 expresses the repetitive portion at a position corresponding to a multiple of the instruction word length N by using a byte-repetition/repetition code 702-1, including a 1-bit flag having the value 1 for indicating a repetition, an approximately corresponding position, and the length of a corresponding portion.

In the flowchart in FIG. 5, the loop including S510, S511, S512, S513, S515, S519, and S510 is executed after steps S508 and S509.

When a data portion having corresponding portions shorter than 2 bytes has been detected in the search for byte repetitions, the byte-repetition code generation unit 306 expresses a word-repetition/non-repetition code 701-2, including a 1-bit flag having the value 0 for indicating a non-repetition and the raw data of the original data 301.

In the flowchart in FIG. 5, the loop including S510, S511, S512, S519, and S510 is executed.

Next, when the switching determination unit 303 has detected that conditions under which the repetition detection unit 302 was able to detect repetitions at positions corresponding to multiples of instruction word length N in the past eight kilobytes of data in the repetition detection operation have occurred consecutively for the number of times "T" as conditions for switching (four times for example), the switching determination unit 303 determines that the original data 301 has transitioned from the data portion to the instruction code portion again, and the switching unit 304 switches from the operations via the byte-repetition code generation unit 306 to the operations via the word-repetition code generation unit 305 on the basis of the detection result. As a result of this, the word-repetition code generation unit 305 generates a word-repetition code again.

The reason that the determination of the number of times "T" as a condition for switching is performed is that repetitions are sometimes detected at positions corresponding to multiples of instruction word length N even in a data portion. Accordingly, by setting the value of "T" to an appropriate value, it is possible to prevent an increase in the number of switching codes that would otherwise be caused by erroneous detections.

In the operational flowchart in FIG. 5, the loop including S510, S511, S512, S513, S514, S516, and S517 is executed after the initialization setting process in steps S501, S509, and S515 and the loop including S510, S511, S512, S513, S514, S516, S519, and S510.

In the above process, the switching unit 304 makes the byte-repetition code generation unit 306 output a byte-repetition/switching code 702-3 in the same format as that of the byte-repetition/repetition code 702-1 before the word-repetition code generation unit 305 generates the code. This switching code is similar to a switching code generated when switching is performed from a word-repetition code to a byte-repetition code, that is, a special code including a 1-bit flag (=1), an approximately corresponding position (=0), and the length of the corresponding portion (=0), for example.

In the operational flowchart in FIG. 5, steps S517, S518, and S502 are executed.

In the above embodiment, as illustrated in FIG. 7, the length of corresponding portions are expressed by a 3-bit code together with the word-repetition/repetition code 701-1 and the byte-repetition/repetition code 702-1 so as to express the correspondence up to, for example, 8 bytes. Also, in the byte-repetition/repetition code 702-1, an approximately corresponding position is expressed in a similar manner as in the conventional LZ77 method, i.e., by using a 13-bit code (2 bytes raised to the 13th power is 8192 bytes or 8 kilobytes) so that an approximately corresponding position in the past eight kilobytes can be expressed. By contrast, in the word-repetition/repetition code 701-1, an approximately corresponding position is always at a position corresponding to a multiple of instruction work length N (four bytes for example), and accordingly 2 bytes, which is needed to express a byte position in units of 4 bytes or smaller, is saved in order to express an approximately corresponding position in the past eight kilobytes so that an approximately corresponding position can be expressed by an 11-bit code. According to a general principle, the number of bits required to express an approximately corresponding position in the word-repetition/repetition code 701-1 can be obtained by the equation below.

$$\log_2(\text{size of searched past data}) - \log_2(\text{instruction word length})$$

Accordingly, when the original data 301 is data including both instruction codes and data, the data compression method according to the present embodiment can reduce by ($\log_2$(instruction word length)) bits the number of bits required to express approximately corresponding positions of repetitions in instruction code portions, as compared to the conventional method. Also, attention is paid to repetitions of instruction codes, and thereby a rate of detecting repetitions can be increased. These are important features relating to the invention.

As illustrated in FIG. 7, for the word-repetition/non-repetition code 701-2 and a byte-repetition/non-repetition code 702-2 used in a case when the length of a corresponding portion is shorter than two bytes, the raw data is expressed by eight bits (i.e., one byte), similarly to the original data 301.

Figure 8:
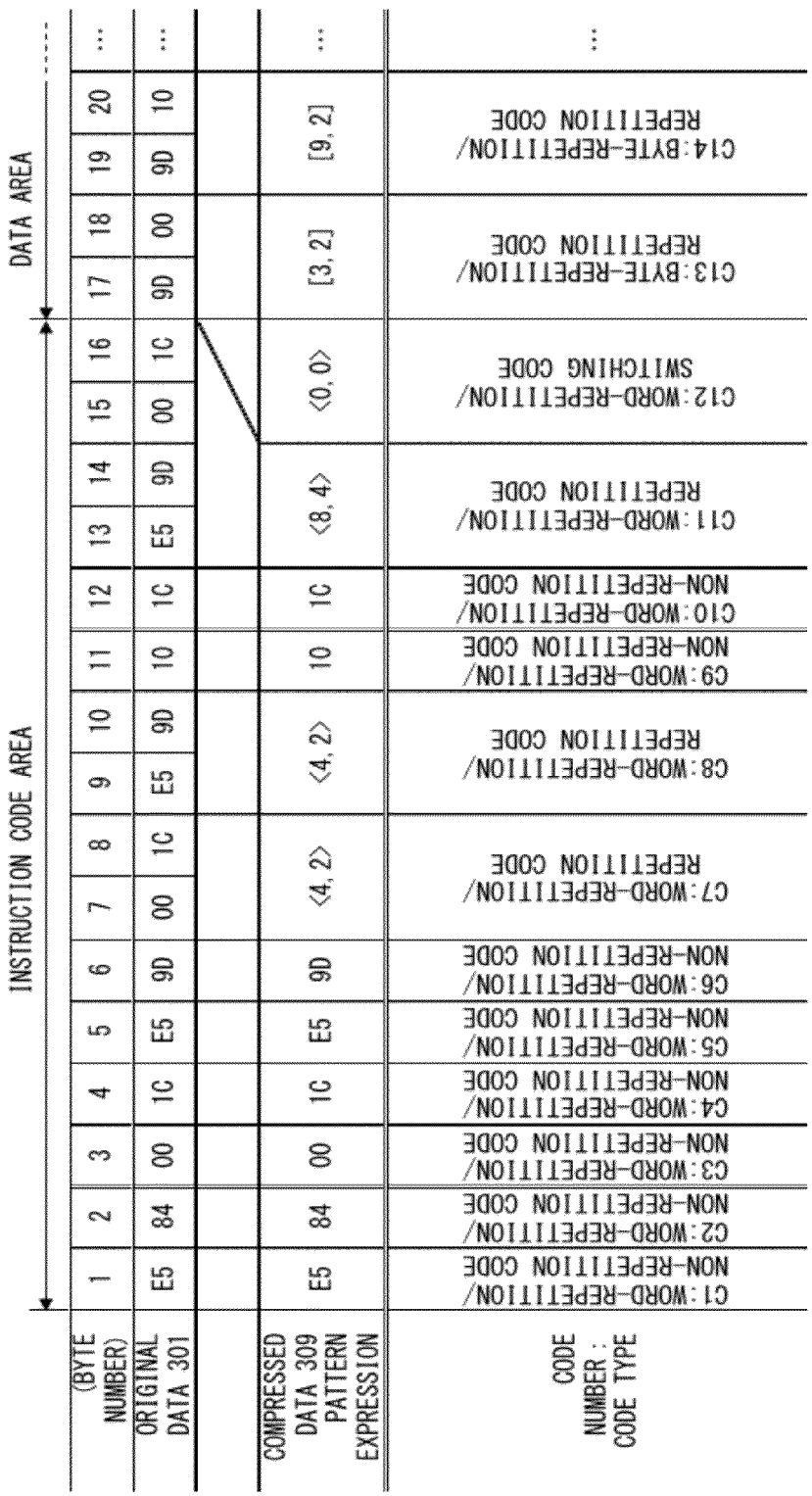
FIG. 8 illustrates generation of codes of compressed data for an example of a byte sequence of original data including both an instruction data area and a data area.

FIG. 8 explains the generation of the compressed data 309 for an example of a byte sequence of the original data 301 including both instruction data areas and data areas.

This process starts with the operation performed by the word-repetition code generation unit 305, and an instruction code area is input as the original data 301.

Because there are no word repetitions in the first through sixth bytes in the past data, the raw data of the original data 301 is output as word-repetition/non-repetition codes C1 through C6 (corresponding to the word-repetition/non-repetition code 701-2 in FIG. 7). In addition, 1-bit flags are omitted in FIG. 7.

In the operational flowchart in FIG. 5, the loop including steps S502, S503, S504, S507, and S502 is executed.

Next, (00, 1C) in the seventh and eighth bytes correspond to the data in the third and fourth bytes, which are anterior by four bytes (a multiple of instruction word length N (N=4)). Accordingly, a code including the approximately corresponding position (=4) and the length of the corresponding portion (=2) is output as word-repetition/repetition code C7 (corresponding to 701-1 in FIG. 7). This is denoted by <4, 2>. In addition, 1-bit flags are omitted in FIG. 7.

(E5, 9D) in the ninth and tenth bytes correspond to data in the fifth and sixth bytes, which are anterior by four bytes (a multiple of instruction word length N (N=4)). Accordingly, word-repetition/repetition code C8 (<4, 2>) is output.

In the operational flowchart in FIG. 5, the loop including steps S502, S503, S504, S505, S507, and S502 is executed.

For the eleventh and twelfth bytes, word repetitive portions cannot be detected, and the raw data of the original data 301 is output as word-repetition/non-repetition codes C7 and C10.

In the operational flowchart in FIG. 5, the loop including steps S502, S503, S504, S507, and S502 is executed.

(E5, 9D, 00, 1C) in the subsequent thirteenth through sixteenth bytes correspond to the fifth through eighth bytes, which are anterior by eight bytes (a multiple of instruction word length N (N=4)). Accordingly, a code <8, 4> including the approximately corresponding position (=8) and the length of the corresponding portion (=4) is output as word-repetition/repetition code C11.

In the operational flowchart in FIG. 5, the loop including steps S502, S503, S504, S505, S507, and S502 is executed.

(9D, 00) in the seventeenth and eighteenth bytes correspond to the data in the fourteenth and fifteenth bytes, which are anterior by three bytes. However, those positions do not correspond to a multiple of instruction word length N (N=4).

Thus, the switching determination unit 303 determines that a switch to a byte-repetition code will occur, and in response to this determination, the switching unit 304 switches from the operations by the word-repetition code generation unit 305 to the operations by the byte-repetition code generation unit 306.

When the above process is performed, the switching unit 304 makes the word-repetition code generation unit 305 output a special code <0, 0> including the approximately corresponding position (=0) and the length of the corresponding portion (=0) as word-repetition/switching code C12 (corresponding to 701-3 in FIG. 7) in the same format as that of the word-repetition/repetition code 701-1 before the byte-repetition code generation unit 306 generates a code.

In the operational flowchart in FIG. 5, the loop including steps S504, S505, S506, and S508 is executed.

Following the above process, the byte-repetition code generation unit 306 starts its operation.

(9D, 00) in the seventeenth and eighteenth bytes correspond to the data in the fourteenth and fifteenth bytes. Accordingly, a code including the approximately corresponding position (=3) and the length of the corresponding portion (=2) is output as byte-repetition/repetition code C13 (corresponding to 702-1 in FIG. 7). This is denoted by [3, 2]. In addition, 1-bit flags are omitted in FIG. 7.

In the operational flowchart in FIG. 5, step S508 is executed.

(9D, 10) in the nineteenth and twentieth bytes correspond to the data in the tenth and eleventh bytes, which are anterior by nine bytes. Accordingly, byte-repetition/repetition code C14 ([9, 2]) is output.

In the operational flowchart in FIG. 5, the loop including steps S510, S511, S512, S513, S515, and S519, S510 is executed after steps S508 and S509.

Figure 9:
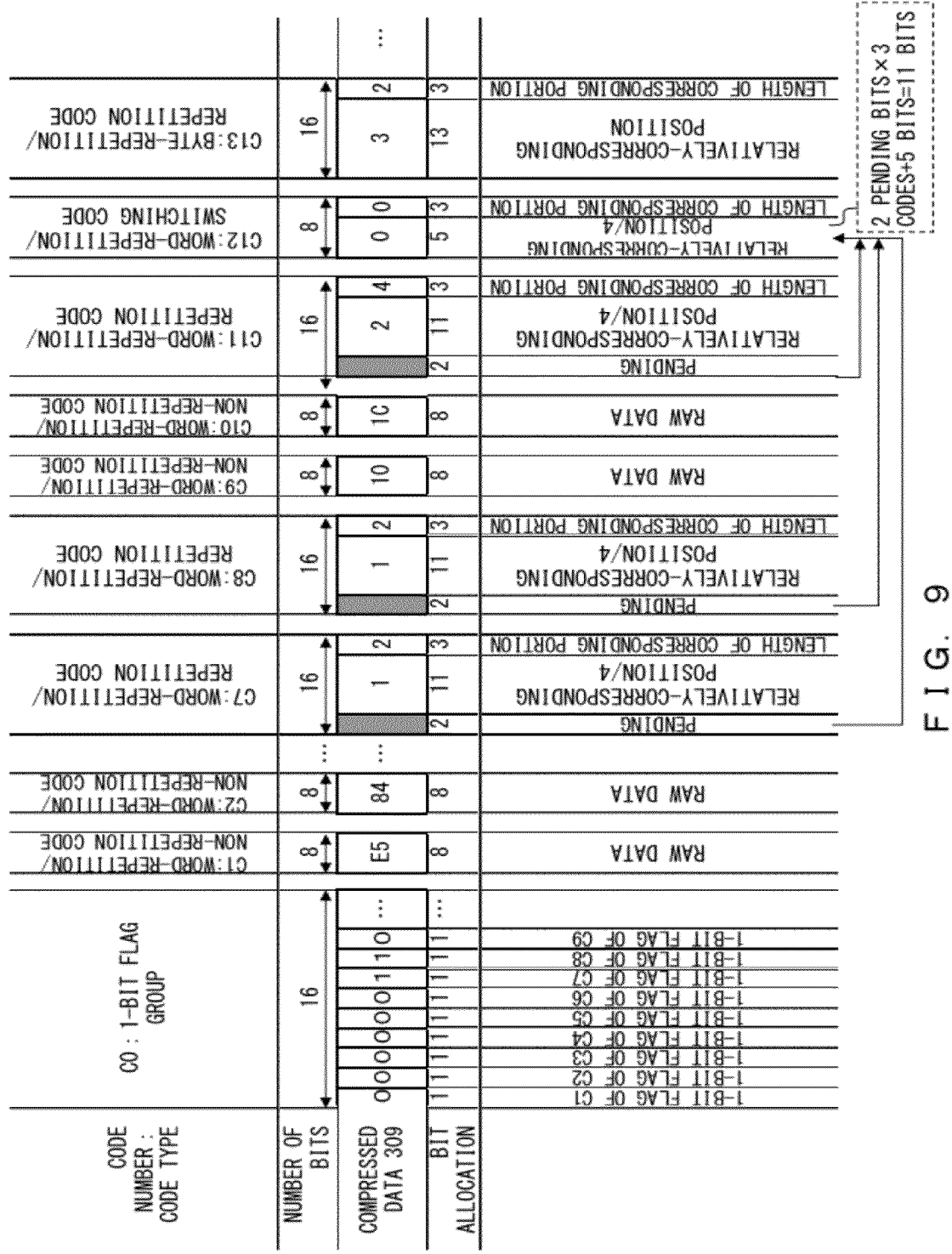
FIG. 9 illustrates an example of codes of compressed data output from a code output unit.

FIG. 9 illustrates an example of a code of the compressed data 309 that is actually output from the code output unit 308 illustrated in FIG. 3 according to the operations in FIG. 8 and the code format illustrated in FIG. 7.

According to the code formats in FIG. 7, 1-bit flags are added to the tops of the word-repetition code 701 and the byte-repetition code 702, respectively. In the example of an output code in FIG. 9, code C0 made up of sixteen bits (i.e., two bytes) contains 1-bit flags for sixteen codes (C1 through C16). Following this, codes C1 through C16 are output. When those sixteen codes have been output, another code made up of sixteen bit (i.e., two bytes) containing the 1-bit flags for the subsequent sixteen codes are output, so that the subsequent sixteen codes are output.

Subsequent to 2-byte code C0 storing a 1-bit flag group, word-repetition/non-repetition codes C1 and C2 illustrated in FIG. 8, codes C3 through C6, which are not illustrated in FIG. 9 (see FIG. 8), and codes C9 and C10 are output, each having a width of eight bits (i.e. one byte). In the eight bits of each of C1 through C6, C9, and C10, the raw data in the first through sixth bytes, eleventh, and twelfth bytes (see FIG. 8) of the original data 301 is stored.

Next, codes C7, C8, and C11 are word-repetition/repetition codes, and accordingly the values 1, 1, and 2, which are results of dividing approximately corresponding positions 4, 4, and 8 respectively by instruction word length N (=4), are stored as respective pieces of 11-bit data, and the values 2, 2, and 4 (see FIG. 8), which are the lengths of the corresponding portions of C7, C8, and C11, are stored as data of three bits.

However, taking memory accessibility into consideration, codes C7, C8, and C11 are actually processed as pieces of 16-bit (i.e., 2-byte) data instead of as 14-bit (approximately corresponding position (=11)+length of corresponding portion (=3)) data. As illustrated in FIG. 9, each code includes a 2-bit pending bit.

The six pending bits (above 2 bits×3) are used as part of a set of eleven bits that constitute the approximately corresponding position of C12 as fourth code C12 of the word-repetition/repetition codes. In other words, the approximately corresponding position is expressed by eleven bits obtained by adding, to the above six pending bits, five bits from among the eight bits (i.e., one byte) constituting code C12, and the remaining three bits are used for expressing the length of the corresponding portion of C12.

As illustrated in FIG. 8, C12 constitutes word-repetition/switching code <0, 0>. In other words, the relative corresponding position is zero, and the length of the corresponding portions is also zero.

Code C13 is a byte-repetition/repetition code, and accordingly the approximately corresponding position of C13 (=3) (see FIG. 8) is stored as 13-bit data, and the length of the corresponding portion of C13 (=2) (see FIG. 8) is stored as 3-bit data. Thus, code C13 constitutes 16-bit data (2-byte data).

The compressed data 309 generated by the data compression function illustrated in FIG. 3(a) or FIG. 5 in the manner illustrated in FIG. 9 can be restored by the data decompression function illustrated in FIG. 3(b) or FIG. 6.

First, the code input unit 310 illustrated in FIG. 3(b) sequentially inputs pieces of the compressed data 309 illustrated in FIG. 9 starting from code C0, and sends the data to the word-repetition decompression unit 313 and the byte-repetition decompression unit 314.

First, the word-repetition decompression unit 313 operates and recognizes that the values in the first through sixteenth bits are all zero in 1-bit flag group C0 made up of the sixteen bits (i.e., two bytes) that were input first from the code input unit 310, and thereby recognizes that the data in the six bytes input subsequently to code C0 are the eight bits (i.e., one byte) (see FIG. 9) of word-repetition/non-repetition codes C1 through C6, and outputs the raw data stored in each byte as the original data 301.

In the operational flowchart in FIG. 6, the loop including steps S601, S602, S603, S606, and S601 is executed.

The latest eight kilobytes (8192 bytes) of the output original data 301 is continuously held in memory.

Next, the word-repetition decompression unit 313 recognizes that the value in the seventh bit is "1" in 1-bit flag group code C0 that was first input from the code input unit 310, thereby recognizes that those sixteen bits (i.e., two bytes) to be input subsequent to code C6 are word-repetition/repetition code C7 (see FIG. 9), extracts the lowest three bits of the data stored in the sixteen bits as the length of the corresponding portion, extracts the next lowest eleven bits as the approximately corresponding position, and holds the remaining two highest bits in a register or the like (not illustrated) for restoring word-repetition/repetition code C12 as the four code, which will be described later. The word-repetition decompression unit 313 reads data up to the extracted length of the corresponding portion from the data at actual approximately corresponding positions obtained by multiplying the above extracted approximately corresponding positions by instruction word length N (=4) from among the data in the latest eight kilobytes held in the memory, and outputs the data as the original data 301 that corresponds to code C7.

In the operational flowchart in FIG. 6, the loop including steps S601, S602, S603, S604, S606, and S601 is executed.

The word-repetition decompression unit 313 recognizes that the value in the eighth bit is "1" in the 1-bit flag group code C0 that was first input from the code input unit 310, thereby recognizes that the sixteen bits (i.e., 2 bytes) input subsequently to code C7 are word-repetition/repetition code C8 (see FIG. 9), restores the original data 301 in the same manner as in the case of code C7, and outputs the restored data.

In the operational flowchart illustrated in FIG. 6, the loop including steps S601, S602, S603, S604, S606, and S601 is executed.

The word-repetition decompression unit 313 recognizes that the values in the ninth and tenth bits are "0", respectively, in 1-bit flag group code C0 input first from the code input unit 310, and thereby recognizes that the two bytes input subsequently to code c8 are eight bits (one byte) each of word-repetition/non-repetition code c9 and word-repetition/non-repetition code C10 (see FIG. 9), and outputs, as the raw data 301, the raw data stored in each byte.

In the operational flowchart in FIG. 6, the loop including steps S601, S602, S603, S606, and S601 is executed.

The word-repetition decompression unit 313 recognizes that the value in the eleventh bit is "1" in 1-bit flag group code C0 input first from the code input unit 310, and thereby recognizes that the sixteen bits (two bytes) input subsequently to code C10 are word-repetition/repetition code C11 (see FIG. 9), and restores the original data 301 in the same manner as in the case of code c7, and outputs the restored data.

In the operational flowchart illustrated in FIG. 6, the loop including steps S601, S602, S603, S604, S606, and S601 is executed.

The word-repetition decompression unit 313 recognizes that the value in the twelfth bit is "1" in 1-bit flag group code C0 input first from the code input unit 310, and thereby recognizes that the one byte input subsequently to code C11 is word-repetition/repetition code C12 (see FIG. 9). The reason for inputting two bytes instead of one byte in such a case is that one of four word-repetition/repetition codes is encoded by using eight bits (i.e., one byte) together with six pending bits, which is obtained by multiplying two bits (caused by the latest three codes) by three (2×3=6). In such a case, the word-repetition decompression unit 313 extracts, as the length of the corresponding portion, the lowest three bits from the data stored in those eight bits, and detects, as the approximately corresponding position, the eleven bits together with six pending bits, which is obtained by multiplying two bits (that have been held in a register or the like when restoring the latest three codes) by three (2×3=6).

In the example illustrated in FIG. 9, word-repetition code C12 is a word-repetition/switching code in which the approximately corresponding position is zero, and the length of the corresponding portion is also zero. This condition is detected and reported to the switching unit 312 by the switching code detection unit 311 illustrated in FIG. 3(b).

As a result of this, the word-repetition decompression unit 313 switches from the word-repetition decompression unit 313 to the byte-repetition decompression unit 314 to perform decompression operations.

In the operational flowchart illustrated in FIG. 6, steps S601, S602, S603, S604, S605, and S607 are performed.

The byte-repetition decompression unit 314 recognizes that the value in the thirteenth bit is "1" in 1-bit flag group code C0 input first from the code input unit 310, thereby recognizes that the sixteen bites (i.e., two bytes) input subsequently to code C12 are word-repetition/repetition code C13 (see FIG. 9), extracts the lowest three bits as the length of a corresponding portion from among the data stored in those sixteen bits, and extracts the remaining highest thirteen bits as the approximately corresponding position. Then, the byte-repetition decompression unit 314 reads data up to the above extracted length of the corresponding portion from the data of the above extracted approximately corresponding position from among the latest eight kilobytes of the data stored in the above described memory, and outputs the data as the original data 301 corresponding to code C13.

In the operational flowchart illustrated in FIG. 6, steps S608, S609, S610, S611, S614, and S608 are executed after the process in step S607.

The byte-repetition decompression unit 314 recognizes, in the 1-bit flag group code input from the code input unit 310, that the data in eight bits or one byte input corresponding to the 1-bit flag whose value was detected to be zero is a byte-repetition/non-repetition code, and outputs, as the original data 301, the raw data stored in that one byte.

In the operational flowchart in FIG. 6, the loop including steps S608, S609, S610, S614, and S608 is executed.

Also, when the approximately corresponding position and the length of the corresponding portion extracted from the restored byte-repetition/repetition code are both zero, the byte-repetition decompression unit 314 detects that the code is a byte-repetition/switching code (corresponding to 702-3 in FIG. 7), and reports this fact to the switching unit 312.

As a result of this, the switching unit 312 switches from the byte-repetition decompression unit 314 to the word-repetition decompression unit 313 to restore data.

In the operational flowchart in FIG. 6, the steps S608, S609, S610, S611, S612, S613, and S601 are executed.

The word-repetition decompression unit 313 and the byte-repetition decompression unit 314 process sixteen codes, process, as a 1-bit flag group code similar to code C0 in FIG. 9, the data in the sixteen bits (i.e., two bytes) input from the code input unit 310, and perform processes similar to the case of above described code c0 in order to process sixteen codes to be input next.

Accordingly, when the original data 301 is data including both instruction codes and data, the data compression method according to the present embodiment makes it possible to reduce by ($\log_2$(instruction word length)) bits the number of bits required to express approximately corresponding positions of repetitions in instruction code portions, as compared to the conventional method. These are important features relating to the invention.

In the above described embodiment, approximately corresponding positions, lengths of corresponding portions, raw data, and the like are expressed in bits; however these elements may be encoded by Huffman codes or arithmetic codes.

According to the above embodiment, when original data includes both instruction codes and data, it is possible to reduce by ($\log_2$(instruction word length)) bits the number of bits required to express approximately corresponding positions of repetitions in instruction code portions, as compared to the conventional method.

Also, by utilizing switching codes, it is possible to improve a compression rate without increasing the burden for decompression.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A data compression method of generating compressed data by compressing compression target data including an instruction code, the method comprising:

a repetition condition determination step of sequentially detecting repetitive portions in the compression target data, and determining whether an approximately corresponding position of the repetitive portion is under a first repetition condition, which is a position corresponding to a multiple of an instruction word length as a number of bytes expressing the instruction code, or a second repetition condition, which is not the first repetition condition;

a first repetition code generation step of generating a first repetition code including at least a value specifying a compression—approximately corresponding position, obtained by dividing the approximately corresponding position that corresponds to the repetitive portion by the instruction word length and a value specifying a length of a corresponding portion at the approximately corresponding position in the repetitive portion, and of outputting the generated code as the compressed data, the generation and the outputting occurring when the repetitive portion is under the first repetition condition;

a second repetition code generation step of generating a second repetition code including at least a value specifying the approximately corresponding position that corresponds to the repetitive portion and a value specifying a length of a corresponding portion at the approximately corresponding position in the repetitive portion, and of outputting the generated code, the generation and the outputting occurring when the repetitive portion is under the second repetition condition; and a switching code generation step of generating a switching code for switching between the first and second repetition codes, and of outputting the generated code as the compressed data.

2. The data compression method according to claim 1, further comprising:

a step of switching to the first repetition code when the first repetition condition has occurred consecutively a prescribed number of times after the second repetition condition; and a step of switching to the second repetition code when the second repetition condition has occurred at least once after the first repetition condition.

3. The data compression method according to claim 1, wherein:

a value directly specifying byte data of the compression target data as the first repetition code or the second repetition code is output when the length of a corresponding portion is shorter than a prescribed number of bytes, and the first repetition code or the second repetition code includes a flag for specifying whether or not the value directly specifying byte data of the compression target data has been output in the first repetition code generation step or the second repetition code generation step.

4. A data decompression method of restoring compression target data from compressed data generated by compressing the compression target data including an instruction code, the method comprising:

a first repetitive portion decompression step of extracting a compression—approximately corresponding position and a length of a corresponding portion from a first repetition code including at least a value specifying the compression—approximately corresponding position, obtained by dividing an approximately corresponding position by an instruction word length, which is a number of bytes expressing the instruction code, and a value specifying the length of a corresponding portion at the approximately corresponding position, and constituting the compressed data, of calculating the approximately corresponding position by multiplying the compression—approximately corresponding position by the instruction word length, of restoring from the compression target data that has already been restored a first repetitive portion corresponding to the calculated approximately corresponding position and the extracted length of a corresponding portion, and of outputting the restored portion as the compression target data;

a second repetitive portion decompression step of extracting the approximately corresponding position and the length of a corresponding portion from a second repetition code including at least a value specifying the approximately corresponding position and a value specifying a length of a corresponding portion at the approximately corresponding position, and constituting the compressed data, of restoring a second repetitive portion corresponding to the extracted approximately corresponding position and the extracted length of a corresponding portion from the compression target data that has already been restored, and of outputting the restored portion as the compression target data; and a switching step of extracting a switching code for switching between the first and second repetition codes from the compressed data, and of switching between the first repetitive portion decompression step and the second repetitive portion decompression step to be performed, the switching being performed on the basis of a timing of the extraction.

5. The data decompression method according to claim 4, wherein:

byte data of the compression target data is extracted directly from data included in the first repetition code or the second repetition code when a flag included in the first repetition code or the second repetition code specifies that a value directly specifying byte data of the compression target data has been output in the first repetitive portion decompression step or the second repetitive portion decompression step.

6. A computer readable storage medium storing a program for a computer that generates compressed data by compressing compression target data including an instruction code, the program making the computer implement:

a repetition condition determination function of sequentially detecting repetitive portions in the compression target data, and determining whether an approximately corresponding position of the repetitive portion is under a first repetition condition, which is a position corresponding to a multiple of an instruction word length as a number of bytes expressing the instruction code, or a second repetition condition, which is not the first repetition condition;

a first repetition code generation function of generating a first repetition code including at least a value specifying a compression—approximately corresponding position, obtained by dividing the approximately corresponding position that corresponds to the repetitive portion by the instruction word length and a value specifying a length of a corresponding portion at the approximately corresponding position in the repetitive portion, and of outputting the generated code as the compressed data, the generation and the outputting occurring when the repetitive portion is under the first repetition condition;

a second repetition code generation function of generating a second repetition code including at least a value specifying the approximately corresponding position that corresponds to the repetitive portion and a value specifying a length of a corresponding portion at the approximately corresponding position in the repetitive portion, and of outputting the generated code, the generation and the outputting occurring when the repetitive portion is under the second repetition condition; and a switching code generation function of generating a switching code for switching between the first and second repetition codes, and of outputting the generated code as the compressed data.

7. The computer readable storage medium according to claim 6, further making the computer implement:

a function of switching to the first repetition code when the first repetition condition has occurred consecutively a prescribed number of times after the second repetition condition; and a function of switching to the second repetition code when the second repetition condition has occurred at least once after the first repetition condition.

8. A computer readable storage medium a program for a computer that restores compression target data from compressed data generated by compressing compression target data including an instruction code, the program making the computer implement:

a first repetitive portion decompression function of extracting a compression—approximately corresponding position and a length of a corresponding portion from a first repetition code including at least a value specifying the compression—approximately corresponding position, obtained by dividing an approximately corresponding position by an instruction word length, which is number of bytes expressing the instruction code, and a value specifying the length of a corresponding portion at the approximately corresponding position, and constituting the compressed data, of calculating the approximately corresponding position by multiplying the compression—approximately corresponding position by the instruction word length, of restoring a first repetitive portion corresponding to the calculated approximately corresponding position and the extracted length of a corresponding portion, from the compression target data that has already been restored, and of outputting the restored portion as the compression target data;

a second repetitive portion decompression function of extracting the approximately corresponding position and the length of a corresponding portion from a second repetition code including at least a value specifying the approximately corresponding position and a value specifying a length of a corresponding portion at the approximately corresponding position, and constituting the compressed data, of restoring a second repetitive portion corresponding to the extracted approximately corresponding position and the extracted length of a corresponding portion from the compression target data that has already been restored, and of outputting the restored portion as the compression target data; and a switching function of extracting a switching code for switching between the first and second repetition codes from the compressed data, and of switching between the first repetitive portion decompression function and the second repetitive portion decompression function to be performed, the switching being performed on the basis of a timing of the extraction.

* * * * *

UNITED STATES PATENT AND TRADEMARK OFFICE
CERTIFICATE OF CORRECTION

PATENT NO. : 8,164,490 B2
APPLICATION NO. : 12/845586
DATED : April 24, 2012
INVENTOR(S) : Noriko Itani It is certified that error appears in the above-identified patent and that said Letters Patent is hereby corrected as shown below:

Column 16, Line 52, In Claim 8, after "medium" insert -- storing --.

Signed and Sealed this
Second Day of October, 2012

David J. Kappos
*Director of the United States Patent and Trademark Office*